(12) United States Patent
Ozeki (10) Patent No.: US 10,184,619 B2
(45) Date of Patent: Jan. 22, 2019

(54) LIGHT EMITTING DEVICE

(71) Applicant: NICHIA CORPORATION, Anan-shi, Tokushima (JP)

(72) Inventor: Kenji Ozeki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 54 days.

(21) Appl. No.: 15/439,211

(22) Filed: Feb. 22, 2017

(65) Prior Publication Data

US 2017/0248281 A1    Aug. 31, 2017

(30) Foreign Application Priority Data

Feb. 29, 2016 (JP) .................. 2016-037279

(51) Int. Cl.
*F21K 9/68* (2016.01)
*F21K 9/66* (2016.01)
(Continued)

(52) U.S. Cl.
CPC .................. *F21K 9/68* (2016.08); *F21K 9/66* (2016.08); *F21V 3/08* (2018.02); *F21V 7/0025* (2013.01); *F21V 13/02* (2013.01); *H01L 33/60* (2013.01); *F21S 41/141* (2018.01); *F21S 41/36* (2018.01); *F21Y 2115/10* (2016.08); *H01L 33/505* (2013.01); *H01L 33/58* (2013.01)

(58) Field of Classification Search
CPC ..... F21K 9/68; F21K 9/66; F21V 3/08; F21V 7/0025; F21V 13/00; H01L 33/60; H01L 33/58; H01L 33/505; F21S 41/36; F21S 41/141; F21Y 2115/10
See application file for complete search history.

(56) References Cited

U.S. PATENT DOCUMENTS

2010/0264438 A1    10/2010  Suenaga
2013/0056781 A1    3/2013   Suenaga
(Continued)

FOREIGN PATENT DOCUMENTS

EP    2618391 A2      7/2013
JP    2010-272847 A   12/2010
(Continued)

OTHER PUBLICATIONS

Extended European Search Report of the corresponding European Patent Application No. 17157151.6, dated Apr. 7, 2017.

*Primary Examiner* — David V Bruce
(74) *Attorney, Agent, or Firm* — Global IP Counselors, LLP (57) ABSTRACT

A light emitting device includes one or more light emitting elements, a light transmissive member, a first light reflective member and a second light reflective member. The light transmissive member is disposed on the one or more light emitting elements and having a first upper surface, a lower surface, first lateral surfaces, and second lateral surfaces each positioned on an outer side of a corresponding one of the first lateral surfaces. The first light reflective member covers the first lateral surfaces. The second light reflective member is disposed on lateral surfaces of the first light reflective member, the second lateral surfaces of the light transmissive member, and lateral surfaces of the one or more light emitting elements.

20 Claims, 5 Drawing Sheets (51) Int. Cl.
    *F21V 7/00*     (2006.01)
    *F21V 13/02*     (2006.01)
    *H01L 33/60*     (2010.01)
    *F21V 3/08*     (2018.01)
    *F21Y 115/10*     (2016.01)
    *H01L 33/50*     (2010.01)
    *H01L 33/58*     (2010.01)
    *F21S 41/141*     (2018.01)
    *F21S 41/36*     (2018.01)

(56) References Cited

U.S. PATENT DOCUMENTS

| | | |
|---|---|---|
| 2013/0188381 A1 | 7/2013 | Kotani |
| 2013/0313602 A1 | 11/2013 | Suenaga |
| 2014/0117396 A1 | 5/2014 | Eisert et al. |
| 2015/0102366 A1 | 4/2015 | Wada |
| 2015/0140702 A1 | 5/2015 | Ikeda |
| 2015/0263254 A1 | 9/2015 | Miyoshi et al. |
| 2016/0079486 A1 | 3/2016 | Sugimoto et al. |
| 2016/0380165 A1 | 12/2016 | Miyoshi et al. |

FOREIGN PATENT DOCUMENTS

| | | | |
|---|---|---|---|
| JP | 2013-149906 A | 8/2013 | |
| JP | WO 2014081042 A1 * | 5/2014 | ............ H01L 33/60 |
| JP | 2015-012143 A | 1/2015 | |
| JP | 2015-079805 A | 4/2015 | |
| JP | 2015-103536 A | 6/2015 | |
| JP | 2015-188069 A | 10/2015 | |
| WO | 2014-081042 A1 | 5/2014 | |
| WO | 2014-171277 A1 | 10/2014 | |

* cited by examiner

LIGHT EMITTING DEVICE

CROSS-REFERENCE TO RELATED APPLICATION

This application claims priority to Japanese Patent Application No. 2016-037279, filed on Feb. 29, 2016, the disclosure of which is hereby incorporated by reference in its entirety.

BACKGROUND

The present disclosure relates to a light emitting device.

In recent years, semiconductor light emitting elements have been utilized not only as light sources for illumination in place of fluorescent lamps, but also as light sources having good directionality and high luminance, such as automotive headlights and floodlights.

Light emitting devices used in such applications have been known. For example, in the light emitting device disclosed in Japanese Unexamined Patent Application Publication No. 2010-272847, in order to achieve high luminance, outer peripheral lateral surfaces of a light transmissive member, which covers and is joined to light emitting elements, are oblique surfaces that spread towards a lower surface of the device, and the oblique surfaces and the portion of the lower surface not joined to the light emitting elements are covered by a light reflective resin.

SUMMARY

For light emitting devices used for automotive applications, however, a light source capable of projecting light of higher luminance is expected.

A light emitting device according to an embodiment of the present disclosure includes one or more light emitting elements, a light transmissive member, a first light reflective member and a second light reflective member. The light transmissive member is disposed on the one or more light emitting elements and having a first upper surface, a lower surface, first lateral surfaces, and second lateral surfaces each positioned on an outer side of a corresponding one of the first lateral surfaces. The first light reflective member covers the first lateral surfaces. The second light reflective member is disposed on lateral surfaces of the first light reflective member, the second lateral surfaces of the light transmissive member, and lateral surfaces of the one or more light emitting elements.

The light emitting device according to an embodiment of the present invention can achieve higher luminance.

DESCRIPTION

Sizes of components and their relative positions shown in each drawing might be exaggerated for the clarity of explanations. In the explanations below, the same designations and reference numerals denote the same members or those of similar quality, for which detailed explanations will be omitted when appropriate. The descriptions given for one example and one embodiment are applicable to other examples and other embodiments.

Light emitting device 10 in this embodiment, as shown in FIG. 1A to FIG. 3, includes light emitting elements 1, a light transmissive member 2, a first light reflective member 3, and a second light reflective member 6. The light transmissive member 2 is disposed on the light emitting elements 1, and has a first upper surface 2a, a lower surface 2b, first lateral surfaces 2c, and second lateral surfaces 2d positioned on an outer side of the first lateral surfaces 2c. The first light reflective member 3 covers the first lateral surfaces 2c of the light transmissive member 2, and the second light reflective member 6 is disposed at lateral surfaces of the first light reflective member 3, the second lateral surfaces 2d of the light transmissive member 2, and lateral surfaces of the light emitting elements 1. In a plan view, the second light reflective member 6 surrounds the first upper surface 2a of the light transmissive member 2, constituting part of an upper surface of the light emitting device 10.

Light Emitting Element

The light emitting elements 1 can be known light emitting element, for example, a light emitting diode having a layered structure, which includes a light emitting layer is formed above a light transmissive substrate, such as sapphire, can be used. Wavelengths of the light emitting elements 1 can be appropriately selected. Examples of blue and green light emitting elements include those employing semiconductor layers of ZnSe, nitride-based semiconductors ($In_XAl_YGa_{1-X-Y}N$, $0 \leq X$, $0 \leq Y$, $X+Y \leq 1$), GaP, and the like. Examples of red light emitting elements include those employing semiconductor layers of GaAlAs, AlInGaP, and the like.

The light emitting elements 1 can be flip-chip mounted on a mounting board by structuring it with a set of positive and negative electrodes on the same surface of the semiconductor stack. In this case, a surface of the semiconductor stack opposite the surface on which the set of electrodes are formed is a light extraction surface of the light emitting element 1.

In this embodiment, the light emitting elements 1 are flip-chip mounted by connecting the set of electrodes disposed on the same plane to a wiring pattern 5 of a mounting board 4 via a bonding member. Each of the light emitting elements 1 has a lower surface on which electrodes are formed, and the opposing upper surface as its light extraction surface.

A single light emitting device may include a single or plural light emitting elements 1. In other words, a single or plural light emitting elements 1 may be covered by a single light transmissive member 2. When covering a plurality of light emitting elements 1 with a single light transmissive member 2, the light emitting elements 1 are preferably orderly arranged so that they form a rectangular shape as a whole in a plan view. In this manner, the shape of the lower surface 2b of the light transmissive member 2 can easily be substantially matched with a peripheral shape of a group of the light emitting elements, thereby reducing non-uniformity of the emission color at the edges of the first upper surface 2a of the light transmissive member 2 which serves as the light emission surface of the light emitting device 10.

Light Transmissive Member 2

The light transmissive member 2, which covers the light extraction surfaces of the light emitting elements 1, is capable of transmitting and outputting light emitted by the light emitting elements 1.

The light transmissive member 2, as shown in FIGS. 2A and 2B, has a first upper surface 2a, a lower surface 2b, first lateral surfaces 2c, and second lateral surfaces 2d located on the outer side than the first lateral surfaces 2c. The first upper surface 2a, serving as the light emission surface of the light emitting device 10, is the surface from which light from the light emitting elements 1 exits to outside, and the lower surface 2b is a surface that covers the light extraction surfaces of the light emitting elements 1.

The first upper surface 2a of the light transmissive member 2 may have an irregular surface shape, a curved surface shape, or a lens shape, but the first upper surface 2a and the lower surface 2b of the light transmissive member 2 are preferably substantially flat surfaced and substantially in parallel with each other. Substantially parallel herein encompasses a tolerance for one of the surfaces to be inclined at an angle of about plus or minus five degrees to the other surface. This achieves the light emitting device 10 having uniform front-surface luminance and reduced color non-uniformity at the first upper surface 2a of the light transmissive member 2 which serves as the light emission surface. The thickness of the light transmissive member 2, in other words, the height from the lower surface 2b to the first upper surface 2a, can be set, for example, in a range between about 50 μm and about 300 μm.

The first lateral surfaces 2c of the light transmissive member 2 are preferably disposed above the second lateral surfaces 2d. In other words, the first lateral surfaces 2c are preferably positioned more distant from the light emitting elements 1 than the second lateral surfaces 2d. That is, the planar area of the light transmissive member 2 is smaller at the top than the bottom. Disposing a light transmissive member 2 structured in this manner on the light emitting elements 1 allows for the light emitting device 10 to have a narrowed light emission surface to achieve high front-surface luminance when the light emitting device 10 uses the first upper surface 2a of the light transmissive member 2 as the light emission surface.

The first lateral surfaces 2c and the second lateral surfaces 2d are preferably substantially flat surfaced, and are substantially in parallel with each other, respectively. The first lateral surfaces 2c and the second lateral surfaces 2d are each substantially perpendicular to the first upper surface 2a and the lower surface 2b. The first lateral surfaces 2c, in particular, are preferably in contact with, and substantially perpendicular to, the first upper surface 2a. Having the first lateral surfaces 2c in contact with and substantially perpendicular to the first upper surface 2a results in clearly defined borders between the light emitting portion (i.e., the first upper surface 2a of the light transmissive member) and the non-light emitting portion (i.e., above the second light reflective member 6 disposed in the periphery of the light transmissive member 2 described later), thereby achieving a light emitting device 10 having higher front-surface luminance.

The second lateral surfaces 2d, moreover, are preferably in contact with, and substantially perpendicular to, the lower surface 2b. Having the second lateral surfaces 2d in contact with and substantially perpendicular to the lower surface 2b can reduce the wetting and spreading of the adhesive material, if used to join the light emitting elements 1 and the light transmissive member 2, onto the second lateral surfaces.

Substantially perpendicular herein means either one of the surfaces forms an angle of about 90 degrees plus or minus five degrees with the other surface.

The second lateral surfaces 2d may be positioned on the outer side of the first lateral surfaces 2c with a gradual inclination, but preferably positioned on the outer side by forming a stair-step. In other words, the light transmissive member 2 preferably has a second upper surface 2e between the first lateral surfaces 2c and the second lateral surfaces 2d.

The second upper surface 2e may be oblique to the first upper surface 2a and/or the lower surface 2b, but is preferably substantially in parallel with the first upper surface 2a and/or the lower surface 2b. In this way, if the second light reflective member 6 described later is disposed on the second upper surface 2e, the second light reflective member 6 can be formed with a uniform thickness on the second upper surface 2e. This reduces leakage of light to the upper surface of the second light reflective member 6 that would result from an non-uniform thickness, thereby achieving a light emitting device 10 having clear borders between the light emitting portion (i.e., the first upper surface 2a of the light transmissive member) and the non-light emitting portion (i.e., above the second light reflective member 6 in the periphery of the first upper surface 2a), and thus higher front-surface luminance.

The second upper surface 2e is disposed along the outer perimeter of the light transmissive member 2 in a plan view. The second upper surface 2e may have different widths in some portions along the outer perimeter of the light transmissive member 2, but preferably has a substantially constant width along the entire perimeter.

A height H of the first lateral surfaces 2c from the lower surface 2b the light transmissive member 2 (i.e., the height from the lower surface 2b to the first upper surface 2a of the light transmissive member 2) shown in FIG. 2B is preferably, for example, in a range between about 5% and about 50% of the thickness of the light transmissive member 2, more preferably in a range between about 15% and about 25%. The larger the value of the height H, the smaller the amount of the second light reflective member 6 disposed above the second upper surface 2e becomes, which might cause light leakage via the second light reflective member 6 located in the periphery of the first upper surface 2a. The smaller the value of the height H, the greater likelihood there is for chipping to occur and the more difficult it is for the light from the light emitting elements 1 to propagate towards the first upper surface 2a.

An area of the lower surface 2b of the light transmissive member 2 is preferably larger than an area of the upper surface of the group of the light emitting elements 1. When a plurality of light emitting elements 1 are covered by a single light transmissive member 2, the lower surface 2b of the light transmissive member 2 preferably covers the entire light extraction surfaces of each of the plurality of light emitting elements 1. With this configuration, the light output surfaces of the light emitting elements 1 is entirely covered, thus loss of light can be reduced. Even if a slight misalignment occurs when the light transmissive member 2 is disposed above the light emitting elements 1, such a misalignment less likely to cause luminance variations because the lower surface 2b of the light transmissive member 2 can cover an entire upper surfaces of the group of the light emitting elements 1. This, as a result, can increase a production yield of the light emitting devices 10. As described later, moreover, in the case where an adhesive material is used to bond the light emitting elements 1 and the light transmissive member 2, a larger light transmissive member 2 than the light emitting elements 1 can alleviate that the adhesive material wet or creep onto the lateral surfaces of the light transmissive member 2. Specifically, the light transmissive member 2 is preferably formed so that the area of its lower surface 2b is in a range between 105% and 200% of the sum of the upper surface areas of all of the light emitting elements 1 that are covered by the light transmissive member 2. Here, the areas described above means the planar areas of the lower surface 2b of the light transmissive and the upper surfaces of the light emitting elements 1 if they are flat surfaces, and areas within the outer perimeters of the lower surface 2b of the light transmissive member 2 and the upper surfaces of the light emitting elements in a plan view if they are not flat surfaces.

The area of the first upper surface 2a of the light transmissive member 2 is preferably smaller than the sum of the upper surface areas of the plurality of light emitting elements provided in a light emitting device 10. In a plan view, the perimeter of the first upper surface 2a of the light transmissive member 2 is preferably positioned in an inner side of the outer perimeter of the group of the light emitting elements disposed on the mounting board.

Furthermore, the area of the first upper surface 2a of the light transmissive member 2 is preferably 70% or smaller of the area of the lower surface 2b of the light transmissive member 2, more preferably 50% or smaller. By providing the first upper surface 2a with a smaller area than the area of the lower surface 2b, the light emitted by the light emitting elements entering from the lower surface 2b of the light transmissive member 2 can exit from the first upper surface 2a (i.e., the light emission surface of the light emitting device 10) having a smaller area. In other words, the light emitting device 10 can illuminate farther because the light emitted from the light emitting elements is increased in luminance by being narrowed by the light transmissive member 2.

It is preferable for both of the first upper surface 2a and the lower surface 2b of the light transmissive member 2 to be substantially rectangular in shape, and their centers overlap in a plan view. This can reduce uneven light emission at the light emission surface of the light emitting device 10 (i.e., the first upper surface 2a).

Providing the light transmissive member 2 with the first lateral surfaces 2c and the second lateral surfaces 2d positioned on the outer side of the first lateral surfaces 2c as described above can secure the area for the lower surface 2b to be able to receive all light emitted from the light emitting elements 1. In addition, received light can exit from the first upper surface 2a (i.e., the light emission surface of the light emitting device 10), which is smaller in area than the light emitting elements 1. This, as a result, can increase luminance.

The light transmissive member 2 can contain a light diffusing agent and a phosphor that can convert the wavelength of at least a portion of the light emitted from the light emitting elements 1. A phosphor-containing light transmissive member 2 can be, for example, a sintered phosphor, a resin, glass, other inorganic materials, or the like, which contains phosphor powder. The sintered phosphor can be formed by sintering a phosphor by itself, or a mixture of a phosphor and a sintering aid. When sintering a mixture of a phosphor and a sintering aid, it is preferable to use an inorganic material, such as silicon oxide, aluminum oxide, or titanium oxide, for the sintering aid. This can reduce discoloration or deformation of the sintering aid resulting from light and heat even when a high power light emitting device is used as the light emitting elements 1. The higher the light transmission of the light transmissive member 2, the more reflection of light can result at an interface with the first light reflective member 3 described later, which increases luminance and is thus preferable. The light transmissive member 2 is preferably composed only of inorganic materials when the light emitting elements 1 have a high light output.

For the phosphors contained in the light transmissive member 2, those that can be excited by the light emitted from the light emitting elements 1 are used. For example, one of the specific examples listed below can be used alone, or in combination of two or more. Specific examples of phosphors that can be excited by a blue or ultraviolet light emitting element include cerium-activated yttrium aluminum garnet-based phosphors (e.g., $Y_3(Al,Ga)_5O_{12}$:Ce); cerium-activated lutetium aluminum garnet-based phosphors (e.g., $Lu_3(Al,Ga)_5O_{12}$:Ce); europium and/or chromium-activated nitrogen-containing calcium aluminosilicate-based phosphors (e.g., $CaO-Al_2O_3-SiO_2$:Eu); europium-activated silicate-based phosphors (e.g., $(Sr,Ba)_2SiO_4$:Eu); nitride-based phosphors, such as β-sialon-based phosphors (e.g., $Si_{6-z}Al_zO_zN_{8-z}$:Eu (0<Z<4.2), CASN-based phosphors (e.g., $CaAlSiN_3$:Eu), and SCASN-based phosphors (e.g., $(Sr,Ca)AlSiN_3$:Eu); manganese-activated potassium silicofluoride-based phosphors (e.g., $K_2SiF_6$:Mn); sulfide-based phosphors; and quantum dot phosphors. By combining these phosphors with a blue or ultraviolet light emitting element, light emitting devices of various colors, for example, a white light emitting device, can be produced. In the case of making a white light emitting device, the types and the concentrations of the phosphors contained in the light transmissive member are adjusted to produce white light. In cases where the light transmissive member 2 contains such phosphor, the concentration of the phosphor is preferably set, for example, in a range between about 5 mass % and about 50 mass %.

For the light diffusing agent that can be contained in the light transmissive member 2, for example, titanium oxide, barium titanate, aluminum oxide, silicon oxide, or the like can be used.

Adhesive Material 7

The light emitting elements 1 and the light transmissive member 2 can be joined using an adhesive material 7. The adhesive material 7 is disposed continuously from the upper surfaces of the light emitting elements 1 to at least a portion of the lateral surfaces to be interposed between the second light reflective member 6 and the lateral surfaces of the light emitting elements 1. An upper surface of the adhesive material 7 interposed between the second light reflective member 6 and the lateral surfaces of the light emitting elements 1 is joined with the lower surface 2b of the light transmissive member 2.

The adhesive material 7 can be any known adhesive, such as epoxy and silicone, an organic adhesive having a high refractive index, or a low melting point glass. The adhesive material 7 is more preferably an inorganic adhesive material. Employing an inorganic adhesive as the adhesive material 7 is convenient when employing high luminance light emitting elements as the light emitting elements 1 because it is not susceptible to heat or light induced degradation. The adhesive material 7 is preferably disposed on the lateral surfaces of the light emitting elements 1 as well as the upper surfaces of the light emitting elements 1. Disposing the adhesive material 7 onto the lateral surfaces of the light emitting elements 1 allows the adhesive to wet and spread between the lower surface 2b of the light transmissive member 2 and the lateral surfaces of the light emitting elements 1 forming fillets that continue to edges of the lower surface 2b of the light transmissive member 2. The fillets are formed to cover the four lateral surfaces of one of the light emitting elements 1 which is rectangular in shape in a plan view. The adhesive material 7 which includes the fillets allows the light from the lateral surfaces of the light emitting elements 1 to become incident on the light transmissive member 2, thereby increasing the light extraction efficiency of the light emitting device 10. It is preferable for the fillets to be extended to a position that is lower than the center of the height of the lateral surfaces of the light emitting elements 1. The joining between the light transmissive member 2 and the light emitting elements 1 can alternatively be achieved by way of direct bonding methods, such as compressing, sintering, hydroxyl group joining, surface activated joining, and atomic diffusion joining.

The first lateral surfaces 2c and the second lateral surfaces 2d of the light transmissive member 2 can be formed to the shapes described above by suitably selecting or changing blade tip angle and blade width of the dicing blade when dividing the light transmissive member 2 to separate the light emitting devices into individual pieces. For example, the individual pieces can be formed by creating grooves in the thickness direction of the light transmissive member 2 by cutting until reaching a half of depth, followed by cutting the light transmissive member 2 by using a blade having a different blade width than that of the blade used in the half-depth cutting.

First Light Reflective Member 3

The first light reflective member 3 is a member that covers the first lateral surfaces 2c of the light transmissive member 2. The first light reflective member 3, in a plan view, is disposed in the surrounding of the first lateral surfaces 2c of the light transmissive member 2.

The first light reflective member 3 preferably covers the first lateral surfaces 2c of the light transmissive member 2 at least partially, more preferably entirely. Furthermore, the first light reflective member 3 preferably covers the second upper surface 2e of the light transmissive member 2 at least partially, more preferably entirely.

For example, when a member containing an organic material, such as resin, is in contact with the light transmissive member 2, cracks might be caused by high density of light or thermal stress in the area that is in contact with the light transmissive member 2. In particular, when cracks occur in the periphery of the first upper surface 2a of the light transmissive member 2, which is the light emission surface of the light emitting device 10, light leaks through the cracks leading to reduction in luminance of the light emitting device 10. Accordingly, in this embodiment, the first light reflective member 3 is disposed so as to be in contact with the first lateral surfaces 2c which is contiguous with the first upper surface. In this manner, even if a crack occurs in the first light reflective member, the progression of the crack can be moderated at the interface between the first light reflective member and the second light reflective member. This makes it less likely for the crack to reach the upper surface of the light emitting device 10, thereby achieving a high luminance light emitting device 10.

Particularly, the light exiting from the first lateral surfaces 2c and the light exiting from the second upper surface 2e of the light transmissive member 2 concentrate in areas next to the first lateral surfaces 2c and areas above the second upper surface 2e increasing the density of light. For this reason, when disposing the second upper surface 2e along the entire perimeter of the light transmissive member 2, it is preferable for the first light reflective member 3 to continuously cover the first lateral surfaces 2c, which are the outer peripheral lateral surfaces of the light transmissive member 2. Giving priority in disposing the first light reflective member 3 in the locations where the light exiting from different directions concentrate can make it less likely for the cracks to reach an outer surface of the light emitting device 10.

Since the area of the first upper surface 2a of the light transmissive member 2 is smaller than the area of the lower surface 2b, the thickness of the second light reflective member 6 disposed above the second upper surface 2e is smaller than that of the second light reflective member 6 disposed on the second lateral surfaces 2d side by the amount equivalent to the heights of the light emitting elements 1 and the second lateral surfaces 2d. For this reason, the thinner portion of the second light reflective member 6 is pulled by a thicker portion of the second light reflective member 6 to the outer peripheral side (i.e., the larger volume portion) due to a thermal expansion occurred by a thermal stress in operation of the light emitting device 10. As a result, there may be occurrence of a crack in the second light reflective member 6 or pealing of the second light reflective member 6 from the light transmissive member 2. Interposing the first light reflective member 3 between the first lateral surfaces 2c and the second light reflective member 6 in this embodiment can reduce occurrence of a gap between the second light reflective member 6 and the light transmissive member 2 caused by pealing the members thereof.

A shape of the first light reflective member 3 can be a film shape, a quadrangular pyramidal shape having the second upper surface 2e as its base, or any of their variations. In other words, the width of the first light reflective member 3 in a sectional view can vary depending on the position in the height direction. Among all, it is preferable for the first light reflective member 3 to have curved outer surfaces facing the second light reflective member 6 described later, which oppose both the first lateral surfaces 2c and the second upper surface 2e. The curved surfaces are preferably in contact with both the first lateral surfaces 2c and the second upper surface 2e, more preferably in contact with the upper edges of the first lateral surfaces 2c and the edges of the second upper surface 2e. The curved surfaces are preferably concave to the second light reflective member 6. Such shape reduces the proportion of the first light reflective member 3 in the light emission surface side of the light emitting device, thereby reducing the leakage of light towards the light emission surface in the event that a crack occurs in the first light reflective member 3.

It is preferable to form the first light reflective member 3 with a material containing a resin for ease of handling and processing.

The first light reflective member 3 can be formed by using a known method, such as printing, jetting, molding, potting, or the like, in the outer perimeter of the light transmissive member 2, i.e. (on the first lateral surfaces 2c and the second upper surface 2e). Among all, potting is preferred. Using such a method can form the first light reflective member 3 to have a stable shape.

The first light reflective member 3 is formed with a material that can reflect the light exiting from the light emitting elements 1. Specifically, it can be formed by having a resin member made of silicone resins, modified silicone resins, epoxy resins, modified epoxy resins, and acrylic resins, or a hybrid resin containing at least one of these resins, or the resin or the hybrid resin thereof containing a light reflecting substance. Examples of the light reflecting substances include titanium oxide, silicon oxide, zirconium oxide, potassium titanate, alumina, aluminum nitride, boron nitride, and mullite. The light reflecting substance content in the first light reflective member 3 is preferably, for example, in a range between 20 and 60 parts by weight to 100 parts by weight of the resin base material, more preferably in a range between 25 and 35 parts by weight.

Second Light Reflective Member

The light emitting device 10, as shown in FIGS. 1A and 1B, includes light emitting elements 1, a light transmissive member 2, and a second light reflective member 6 that surrounds the first light reflective member 3. Specifically, the second light reflective member 6 is disposed to cover the first light reflective member, the second lateral surfaces of the light transmissive member, and the lateral surfaces of the light emitting elements. The first upper surface 2a of the light transmissive member 2, however, is preferably not covered by and exposed from the second light reflective member 6. For this purpose, it is preferable for the first upper surface 2a of the light transmissive member 2 and the upper surface of the second light reflective member 6 to be coplanar, or the upper surface of the second light reflective member 6 to be lower than the first upper surface 2a of the light transmissive member 2.

In general, the light exiting from the upper surface of the light transmissive member, which serves as the light exiting surface, has lateral spread. If the upper surface of the second light reflective member were higher than the height of the upper surface of the light transmissive member, the light exiting from the upper surface of the light transmissive member would hit and be reflected by the second light reflective member, thereby causing variation in luminous intensity distribution. Accordingly, by covering the lateral surfaces of the light transmissive member and the first light reflective member with the second light reflective member while setting the height of the second light reflective member covering the periphery of these lateral surfaces low, the exiting light can be directly extracted.

When the light emitting elements 1 are disposed on a mounting board it is preferable for the second light reflective member 6 to also be disposed between the light emitting elements 1 and the mounting board. Furthermore, when a plurality of light emitting elements are arranged, it is preferable for the second light reflective member 6 to also be disposed between the plurality of the light emitting elements. With this configuration, light emitted from one light emitting element is less likely to propagate to an adjacent light emitting element, which causes light degradation, thereby increasing the light extraction efficiency.

The second light reflective member 6 is formed with a material that can reflect light emitted by the light emitting elements 1. Specifically, a resin member similar to the first light reflective member 3 discussed above can be used. A light reflecting substance content in the second light reflective member 6 is preferably in a range between 20 and 80 parts by weight relative to 100 parts by weight of the base resin member, particularly preferably in a range between 55 and 65 parts by weight. It is preferable to set the light reflecting substance content in the second light reflective member higher than a light reflecting substance content in the first light reflective member as it makes it possible to more extensively reduce leakage of light from the light emitting device to the outside.

The second light reflective member 6 can be formed by, for example, injection molding, potting, printing, transfer molding, compression molding, or the like.

The second light reflective member 6 is preferably formed after curing the first light reflective member 3. This forms an interface between the two even if the same material was used for the first light reflective member 3 and the second light reflective member 6, which can moderate the progression of cracks described earlier. For example, it is preferable to use a resin material having a lower modulus (i.e., soft) than the first light reflective member 3 for the second light reflective member 6 as it allows for reduction in the occurrences of cracks and separation of the second light reflective member described earlier.

The light emitting device 10 can be provided with a protection device, such as a Zener diode. Embedding the protection device in the second light reflective member 6 can prevent reductions in light extraction attributable to absorption or blocking of light from the light emitting elements 1 by the protection device.

Mounting Board

In a light emitting device, as shown in FIGS. 1A and 1B, light emitting elements 1 are usually mounted on a mounting board 4.

Examples of materials for use for the mounting board include insulating materials, such as glass epoxy, resins, and ceramics; and metal materials on which an insulating material is formed. Among all, those utilizing a highly heat resistant and highly environmental resistant ceramic material are preferable for the mounting board. Examples of ceramic materials include alumina, aluminum nitride, and mullite. These ceramic materials can also be combined with an insulating material, such as BT resin, glass epoxy, and epoxy-based resin.

A mounting board 4 having a wiring pattern 5 formed thereon to be connected to the light emitting elements 1 is usually used. The wiring pattern 5 can be formed using a metal, for example, copper, aluminum, gold, silver, platinum, titanium, tungsten, palladium, iron, and nickel, or an alloy of these. The wiring pattern formed on the upper surface of the mounting board is preferably covered with a highly reflective material, such as silver or gold, as its uppermost surface for efficiently extracting light from the light emitting elements 1. The wiring pattern can be formed by electroplating, elctroless plating, vapor deposition, sputtering, or the like. When Au bumps are used to mount a light emitting element on the mounting board, for example, using Au on the uppermost surface of the wiring pattern can improve the bonding between the light emitting element and the mounting board.

Such mounting board can be one known in the art, and any mounting board for use in mounting light emitting elements and the like can be used.

Example 1

Figure 1:
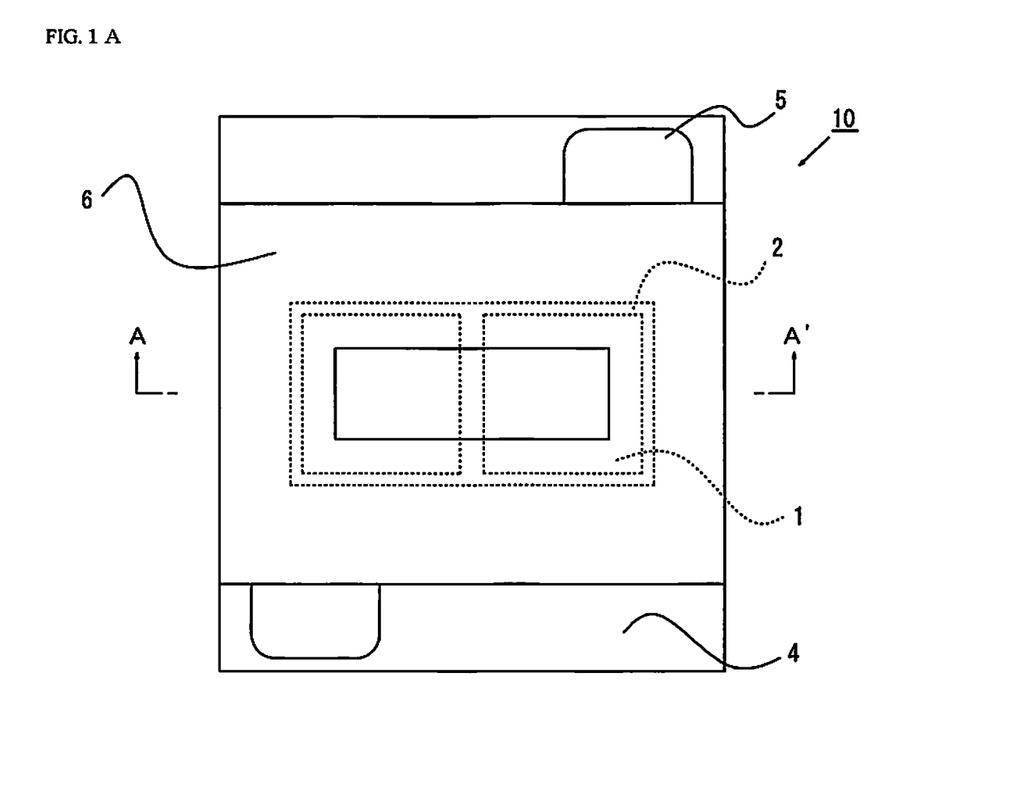
FIG. 1A is a schematic plan view of a light emitting device according to an embodiment of the present invention.
FIG. 1B is a sectional view along line A-A' indicated in FIG. 1A.
Figure 2:
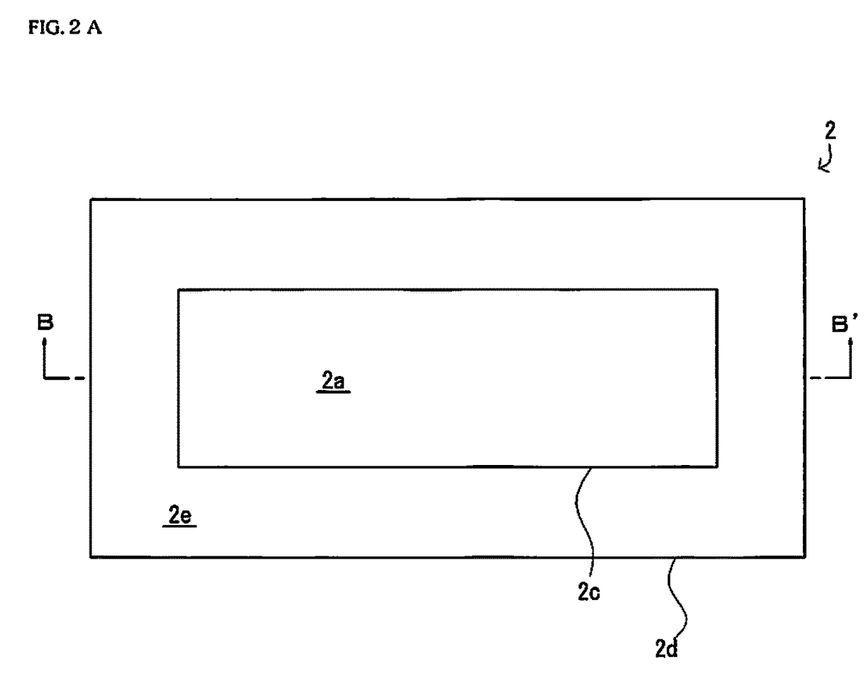
FIG. 2A is a schematic plan view showing a light transmissive member used in the light emitting device according to the embodiment of the present invention.
FIG. 2B is a sectional view along line B-B' indicated in FIG. 2A.
Figure 3:
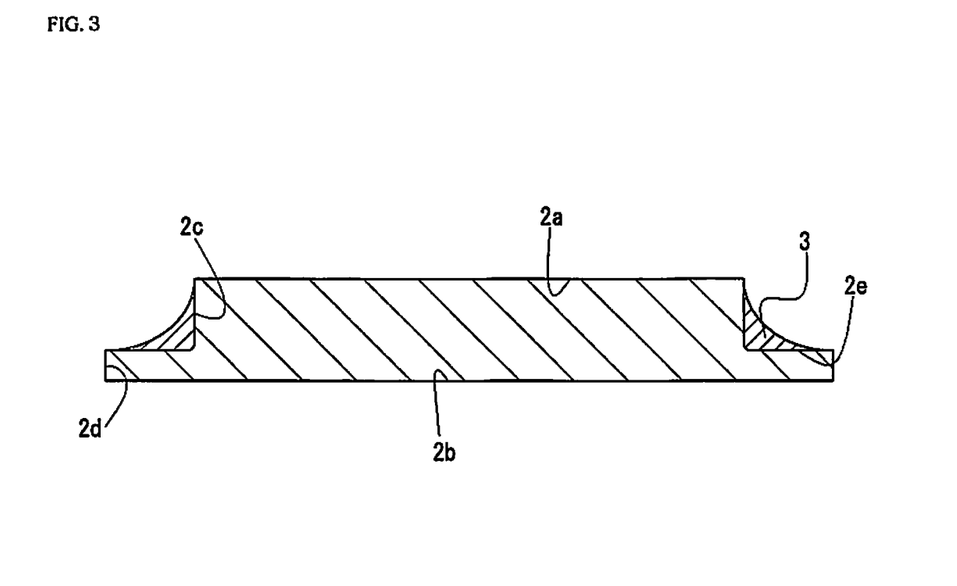
FIG. 3 is a schematic sectional view showing the light transmissive member and a first light reflective member used in the light emitting device according to the embodiment of the present invention.

A light emitting device 10 as shown in FIGS. 1A and 1B is prepared using a light transmissive member 2 as shown in FIGS. 2A and 2B, forming and using a first light reflective member 3 as shown in FIG. 3, and its luminance distribution is measured.

This light emitting device 10 has two serially arranged light emitting elements 1 (e.g., 0.8 mm×0.8 mm in size) mounted on the mounting board 4. The mounting board 4 is made of an aluminum nitride plate having a thermal conductivity of about 170 W/mK on which titanium, palladium, and gold were patterned by vapor deposition in this order onto which gold plating is further applied. The light emitting elements 1 are flip-chip mounted using gold bumps.

An upper surfaces of the light emitting elements 1 are covered by the light transmissive member 2 which is a glass sheet containing a YAG phosphor dispersed therein (e.g., YAG phosphor content of 5-10 mass %). A size of a first upper surface 2a of the light transmissive member 2 is about 0.6 mm× about 1.55 mm, a size of a lower surface 2b is about 1.95 mm× about 1.0 mm, and both are substantially rectangular in shape. A second upper surface 2e located between a first lateral surfaces 2c and a second lateral surfaces 2d is provided along an entire outer perimeter of the light transmissive member 2, and is about 0.2 mm in width.

The light emitting elements 1 and the light transmissive member 2 are joined by using a light-guiding member made of a silicone resin. A height of the light transmissive member 2 from the lower surface 2b to the first upper surface 2a is about 230 μm, of which a height H from the lower surface 2b to the first lateral surfaces 2c is about 50 μm.

The first light reflective member 3, which contains 30 parts by weight of titanium oxide with respect to 100 parts by weight of a silicone resin, was formed by potting so as to completely cover the first lateral surfaces 2c and the second upper surface 2e of the light transmissive member 2.

Lateral surfaces of the light emitting elements 1, the light transmissive member 2, and the first light reflective member 3 are surrounded by a second light reflective member 6 formed by potting. The second light reflective member 6 is composed of 100 parts by weight of a silicone resin which contains 60 parts by weight of titanium oxide.

The light emitting device 10 constructed as above has clearer borders between a light emission portion and a non-light emission portion, achieving higher front-surface luminance.

The light emitting devices according to the present invention can be used in not only automotive light sources, but also various other types of light sources, such as for lighting, various types of indicators, displays, liquid crystal backlights, traffic signals, automotive parts, and channel letters for signage.

What is claimed is:

1. A light emitting device comprising:
   one or more light emitting elements;
   a light transmissive member disposed on the one or more light emitting elements and having a first upper surface, a lower surface, first lateral surfaces, and second lateral surfaces each positioned on an outer side of a corresponding one of the first lateral surfaces;
   a first light reflective member covering the first lateral surfaces; and
   a second light reflective member disposed on lateral surfaces of the first light reflective member, the second lateral surfaces of the light transmissive member, and lateral surfaces of the one or more light emitting elements, wherein
   a height of the second lateral surface of the light transmissive member is in a range between 5% and 50% of a height of the light transmissive member from the lower surface to the first upper surface.

2. The light emitting device according to claim 1, wherein
   the light transmissive member has a second upper surface between each of the first lateral surfaces and a corresponding one of the second lateral surfaces, and
   the first light reflective member covers the second upper surface.

3. The light emitting device according to claim 2, wherein the first upper surface is parallel to the second upper surface.

4. The light emitting device according to claim 2, wherein the first lateral surfaces are in contact with and perpendicular to the first upper surface.

5. The light emitting device according to claim 2, wherein the second lateral surfaces are in contact with and perpendicular to the lower surface.

6. The light emitting device according to claim 2, wherein the first light reflective member has curved surfaces facing the second light reflective member.

7. The light emitting device according to claim 6, wherein each of the curved surfaces is in contact with a corresponding one of the first lateral surfaces and the second upper surface.

8. The light emitting device according to claim 6, wherein the curved surfaces facing the second light reflective member are concaved surfaces.

9. The light emitting device according to claim 1, wherein the first light reflective member continuously covers the first lateral surfaces along an outer periphery of the light transmissive member.

10. The light emitting device according to claim 1, wherein
    the light transmissive member contains a phosphor.

11. The light emitting device according to claim 1, wherein
    the first light reflective member is made of a resin material.

12. The light emitting device according to claim 1, wherein
    the second light reflective member is made of a resin material that is the same as a resin material of the first light reflective member.

13. The light emitting device according to claim 1, wherein
    an area of the first upper surface of the light transmissive member is 50% or smaller than an area of the lower surface of the light transmissive member.

14. The light emitting device according to claim 1, wherein
    the one or more light emitting elements and the light transmissive member are joined using an adhesive material.

15. The light emitting device according to claim 1, wherein
    an area of the lower surface of the light transmissive member is larger than an area of an upper surface of the one or more light emitting elements.

16. The light emitting device according to claim 1, wherein
    an area of the first upper surface of the light transmissive member is smaller than a sum of one or more upper surface areas of the one or more light emitting elements included in the light emitting device.

17. A light emitting device comprising:
    one or more light emitting elements;
    a light transmissive member disposed on the one or more light emitting elements and having a first upper surface, a lower surface, first lateral surfaces, and second lateral surfaces each positioned on an outer side of a corresponding one of the first lateral surfaces;
    a first light reflective member covering the first lateral surfaces; and
    a second light reflective member disposed on lateral surfaces of the first light reflective member, the second lateral surfaces of the light transmissive member, and lateral surfaces of the one or more light emitting elements, wherein
    the light transmissive member has a second upper surface between each of the first lateral surfaces and a corresponding one of the second lateral surfaces, the first light reflective member covers the second upper surface, and the first light reflective member has curved surfaces facing the second light reflective member.

18. The light emitting device according to claim 17, wherein the light transmissive member contains a phosphor.

19. The light emitting device according to claim 17, wherein an area of the first upper surface of the light transmissive member is smaller than a sum of one or more upper surface areas of the one or more light emitting elements included in the light emitting device.

20. A light emitting device comprising:

one or more light emitting elements;

a light transmissive member disposed on the one or more light emitting elements and having a first upper surface, a lower surface, first lateral surfaces, and second lateral surfaces each positioned on an outer side of a corresponding one of the first lateral surfaces;

a first light reflective member covering the first lateral surfaces; and a second light reflective member disposed on lateral surfaces of the first light reflective member, the second lateral surfaces of the light transmissive member, and lateral surfaces of the one or more light emitting elements, wherein an area of the first upper surface of the light transmissive member is 50% or smaller than an area of the lower surface of the light transmissive member.

* * * * *